United States Patent
Sumnitsch et al.

[11] Patent Number: 6,162,739
[45] Date of Patent: Dec. 19, 2000

[54] PROCESS FOR WET ETCHING OF SEMICONDUCTOR WAFERS

[75] Inventors: Franz Sumnitsch, Klagenfurt; Gerald Wagner, Velden, both of Austria

[73] Assignee: SEZ Semiconductor-Equipment Zubehor fur die Halbleiterfertigung AG, Villach, Austria

[21] Appl. No.: 09/248,094

[22] Filed: Feb. 11, 1999

[30] Foreign Application Priority Data

Feb. 11, 1998 [DE] Germany ............................ 198 05 525

[51] Int. Cl.$^7$ .................................................. H01L 21/302
[52] U.S. Cl. ........................ 438/745; 438/747; 438/748; 438/750; 438/756
[58] Field of Search ..................................... 438/745, 747, 438/750, 756, 691, 748; 216/16

[56] References Cited

U.S. PATENT DOCUMENTS

| | | | |
|---|---|---|---|
| 4,087,367 | 5/1978 | Rioult et al. | 252/79.1 |
| 4,230,522 | 10/1980 | Martin et al. | 438/669 |
| 4,582,624 | 4/1986 | Enjo et al. | 252/79.4 |
| 4,620,934 | 11/1986 | Hopkins et al. | 252/79.4 |
| 4,759,823 | 7/1988 | Asselanis et al. | 216/101 |
| 4,795,582 | 1/1989 | Ohmi et al. | 252/79.3 |
| 4,871,422 | 10/1989 | Scardera et al. | 216/99 |
| 5,256,247 | 10/1993 | Watanabe et al. | 216/16 |
| 5,439,553 | 8/1995 | Grant et al. | 216/58 |
| 5,755,989 | 5/1998 | Ishii et al. | 252/79.4 |
| 5,759,917 | 6/1998 | Grover | 438/690 |
| 5,824,601 | 10/1998 | Dao et al. | 438/713 |
| 5,972,124 | 10/1999 | Sethuraman et al. | 134/7 |

FOREIGN PATENT DOCUMENTS

| | | |
|---|---|---|
| 0 405 886 | 2/1991 | European Pat. Off. . |
| 49-52799 | 5/1974 | Japan . |
| 58-55324 | 4/1983 | Japan . |
| 63-283028 | 11/1988 | Japan . |
| 3-179737 | 8/1991 | Japan . |
| 9-181026 | 7/1997 | Japan . |
| WO 94/27314 | 11/1994 | WIPO . |

OTHER PUBLICATIONS

D.J. Monk et al., "Hydrofluoric Acid Etching or Silicon Dioxide Sacrificial Layers", pp. 264–269, J. Electrochem. Soc., vol. 141, No. 1, Jan. 1994.

E. Gaulhofer, "Spin Etcher for Removal of Backside Depositions", pp. 57–58 and 219, Solid State Technology, May 1991.

*Primary Examiner*—Benjamin L. Utech
*Assistant Examiner*—Binh X Tran
*Attorney, Agent, or Firm*—Young & Thompson

[57] ABSTRACT

A process of controlled wet etching of semiconductor wafers having a silicon dioxide layer on each of two surfaces, includes entirely removing the silicon dioxide layer from a top side and selectively removing the silicon dioxide layer from the opposite side bottom in a defined area which extends to the inside from the peripheral edge of the semiconductor wafer using an etching medium which includes hydrofluoric acid or a combination of hydrofluoric acid and ammonium fluoride and at least one carboxylic acid.

19 Claims, 2 Drawing Sheets

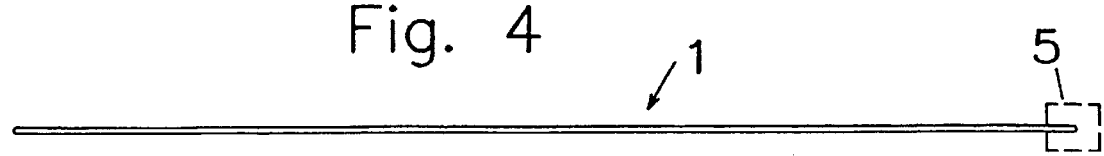
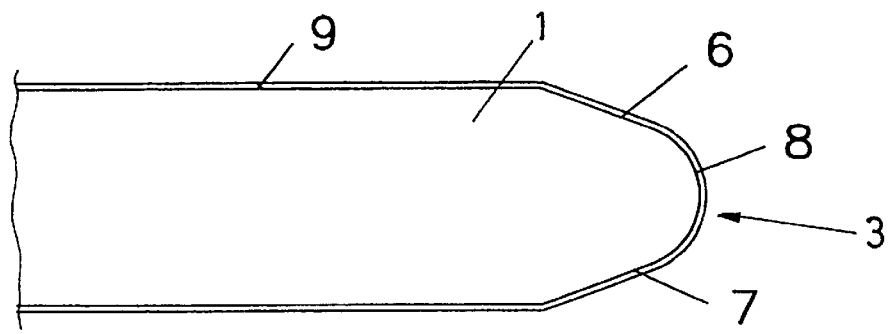
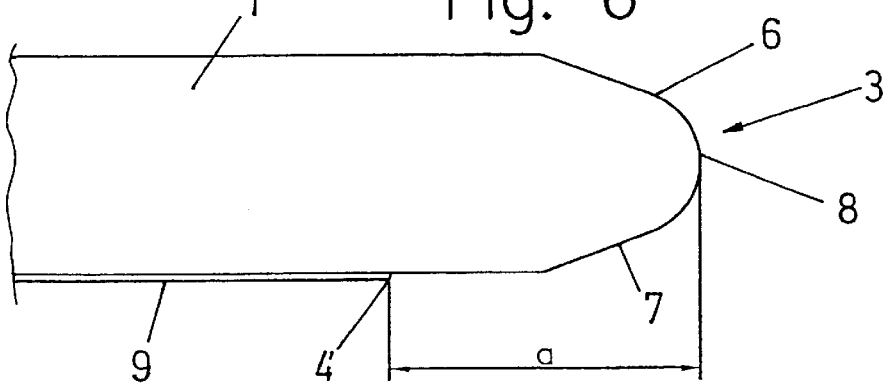

PROCESS FOR WET ETCHING OF SEMICONDUCTOR WAFERS

BACKGROUND OF THE INVENTION

The invention relates to a process for wet etching of semiconductor wafers with which a layer, for example, a silicon dioxide layer, can be removed from the wafer by etching.

DESCRIPTION OF THE RELATED ART

In the production of semiconductor wafers it is often necessary to remove the (silicon dioxide) layer from one surface (top) of the wafer, from the edge of the wafer and in a defined edge area of the other surface of the wafer (bottom) by undercutting. In particular, removal of the (silicon dioxide) layer in a defined edge area from the bottom of the wafer (undercutting) has been found to be a problem. This undercutting is however necessary and must proceed in an exactly defined area, so that in the subsequent processes which are executed on the wafer and which are to be carried out as far as the edge area the (silicon dioxide) layer cannot exert any adverse effect. This is important for example when a metal layer is applied (for example, gold) to the semiconductor wafers.

JP 09-181026 A describes a carrier for semiconductor wafers (Bernoulli chuck) which outside the ring nozzle has a special shape, for example, an annular step which declines to the outside, or a bevelling of its edge. This shape is designed to influence the flow velocity of the gas discharging through the ring nozzle. These measures and configurations of the Bernoulli chuck of JP 09-181026 A are intended to be used to enable the liquid treatment medium applied from the outside to flow around the edge of the wafer onto the side (bottom) facing the carrier and there to treat the edge area by etching. In JP 09-181026 furthermore the dependency of the amount of etching medium which reaches the underside of the semiconductor wafer on the flow speed of the treatment medium and on the flow speed of the gas discharging through the ring nozzle is further discussed.

JP 09-1811026 A however contains no information on the type of layer which is to be treated, in particular a silicon dioxide layer not being mentioned. Which etching medium can be used is equally little described in JP 09-181026 A.

Experience has shown that to the extent (as is conventional in semiconductor production) pure diluted or also concentrated hydrofluoric acid is used for etching of a silicon dioxide layer, an optimum result is not achieved, especially in undercutting. Specifically the edge of the silicon dioxide layer which remains on the bottom is not a circular line, but a more or less frayed or jagged line; this is a disadvantage. This inaccuracy in undercutting can go so far that in spite of optimally set process parameters (rpm of the carrier, flow velocity of the treatment medium and flow velocity of the gas (usually nitrogen) emerging from the ring nozzle of the carrier) to some extent first of all the edge of the wafer is not etched, but in any case no undercutting occurs, or the silicon dioxide layer on the bottom of the wafer is etched so far so that a very irregular etching border arises on the bottom.

In semiconductor engineering it is known that a silicon dioxide layer can be removed with aqueous hydrofluoric acid by etching, water soluble hexafluorosilicic acid ($H_2SiF_6$) being formed. In semiconductor engineering adding ammonium fluoride to the hydrofluoric acid is also known. These etching media are called BOE (buffered oxide etch) or BHF (buffered hydrogen fluoride).

Use of organic acids in hydrofluoric acid-containing etching media is known for etching media which are used for etching of elementary silicon. These etching media contain not only hydrofluoric acid, but also an oxidation agent, such as nitric acid, hydrogen peroxide, or bromine. Acetic acid is added to these etching media as a so-called moderator in order to make the etching reactions controllable.

Adding acetic acid to the etching media is also known. This is mentioned in the catalog "Merck Electronic Chemicals", 1997 edition, page 38 with the purpose that the acetic acid in the etching media which contain nitric acid or phosphoric acid is used as a wetting agent. According to this catalog the addition of acetic acid influences the etching rate and the selectivity of the etching process. Since in semiconductor manufacture as a result of the sensitivity of all processes it can be assumed that everything which is not expressly recommended should be avoided, it can be assumed that in the prior art the addition of organic acids to a pure hydrofluoric acid is rejected.

It has already been recommended that ethylene glycol be added to the ammonium-fluoride containing etching media to increase selectivity, for example, relative to phosphorus silicate glass. But the addition of ethylene glycol to pure hydrofluoric acid is not known.

In U.S. Pat. No. 4,269,654 A an etchant is described for etching of silicon nitride and silicon dioxide and it contains hydrofluoric acid and an organic solvent with a high boiling point (for example glycol or glycerin). In U.S. Pat. No. 4,269,654 A however the application of the etching medium described there to rotating wafers in a so-called single wafer process is mentioned. Use of the etching medium for controlled undercutting on the other hand is not mentioned.

SUMMARY OF THE INVENTION

The object of the invention is to propose a process which is suitable for treating a defined edge area on the bottom of a semiconductor wafer (the side of the wafer facing the carrier) by etching. In doing so one exact edge of the (silicon dioxide) layer which remains on the bottom after undercutting will form.

This object is achieved as claimed in the invention with a process as claimed in claim 1.

Advantageous and preferred embodiments of the process as claimed in the invention are the subject matter of the dependent claims.

As a result of the flow behavior and wetting behavior of the etching medium, due to the etchant medium used as claimed in the invention undercutting of the wafers takes place in an exactly defined manner so that the area etched on the bottom of the semiconductor wafer ends with a clear, exact line, therefore a disadvantageous frayed, jagged edge which borders the silicon dioxide layer on the bottom of the wafer is not formed. In particular the etchant used as claimed in the invention is inert to elemental silicon, since it does not contain any oxidation agent.

Surprisingly the advantageous effect of the etching medium used as claimed in the invention is achieved by the addition of a carboxylic acid as claimed in the invention.

The basis of the etching medium used as claimed in the invention is its effective component which attacks the silicon dioxide layer to be removed by etching, specifically hydrofluoric acid or a combination of hydrofluoric acid/ammonium fluoride.

In the process as claimed in the invention the liquid etching medium as claimed in the invention is applied to the top (the side turned away from the carrier) of a rotating semiconductor wafer in a continuous stream, the etching medium flowing around the edge of the wafer in a defined manner onto the bottom of the wafer (the side facing the carrier) and etches there in a defined manner.

The etching result during undercutting is made uniform as claimed in the invention mainly by the etching medium as claimed in the invention containing in addition to the etchant (for example HF or HF/NH$_4$F) as at least one carboxylic acid, for example formic acid, acetic acid, propionic acid, butyric acid, benzoic acid, citric acid, oxalic acid, or lactic acid, a salt thereof, preferably an ammonium salt, or a derivative of an organic acid, such as an anhydride, for example acetic acid anhydride.

The carboxylic acids especially under consideration are polar, organic substances with a boiling point above 50° C., which are inert to hydrofluoric acid, therefore do not chemically react with them.

Especially preferred are organic carboxylic acids with at least two carbon atoms (especially propionic acid and also acetic acid) and their derivatives, especially acid anhydrides.

A molar ratio between the hydrofluoric acid and the carboxylic acids (HF:acid) of 3:1 to 1:2 is advantageously maintained.

The etching medium used as claimed in the invention can be diluted up to 90% with water, especially deionized water. Dilution has only an insignificant effect on making undercutting uniform and causes simply a lower etching rate.

It is advantageous that the carboxylic acid added to the etching medium is miscible with water and is inert to hydrofluoric acid.

The aforementioned molar ratio is important to the extent that an overly high molar ratio (high hydrofluoric acid concentration relative to the concentration of the carboxylic acid) causes irregular undercutting. Conversely a low molar ratio (low hydrofluoric acid concentration relative to the concentration of carboxylic acid) takes effect in overly low undercutting.

One advantage of the process as claimed in the invention and the etching medium used can consist in that the etching takes place uniformly also in the area of the retaining pins which adjoin the edge of the wafer and support it laterally, so that unetched or poorly etched sites do not occur in the area of these retaining pins (so-called pin marks).

BRIEF DESCRIPTION OF THE DRAWINGS

Other details of the invention follow from the following description in which reference is made to the attached drawings.

FIG. 4 shows in cross section a semiconductor wafer, FIG. 5 shows on an enlarged scale the edge of a semiconductor wafer, and FIG. 6 shows in a view similar to FIG. 5 the edge of a semiconductor wafer after etching.

Figure 1:
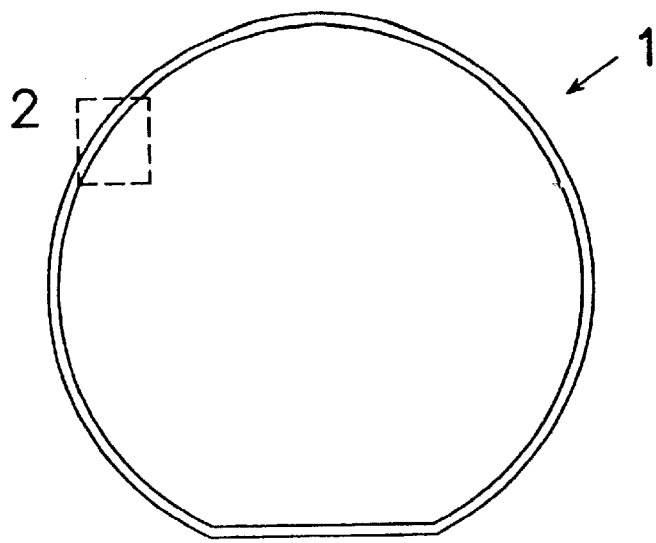
FIG. 1 shows the side of a semiconductor wafer after undercutting.
Figure 2:
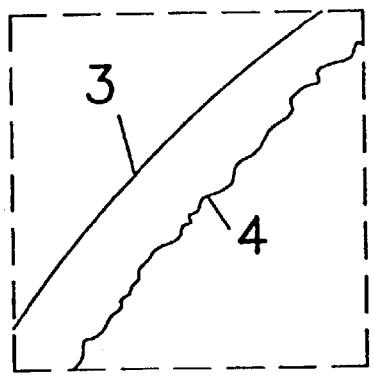
FIG. 2 shows a cutout of the edge area of an undercut wafer with irregular undercutting (prior art), FIG. 3 in a view similar to FIG. 2 shows the edge area with good undercutting (invention)

A semiconductor wafer 1 after etching bears on its bottom (the side visible in FIG. 1) which faces the carrier (Bernoulli chuck) during the etching process an area in which the silicon dioxide layer 9 has not been removed by the etching process. When known etching media are used during etching of semiconductor wafers with the objective of removing the silicon dioxide layer as described, the irregularly formed and jagged edge 4 of the silicon dioxide layer shown in FIG. 2 arises on the bottom of the semiconductor wafer 1. The edge 4 therefore does not have a uniform distance from the edge 3 of the semiconductor wafer 1.

Figure 3:
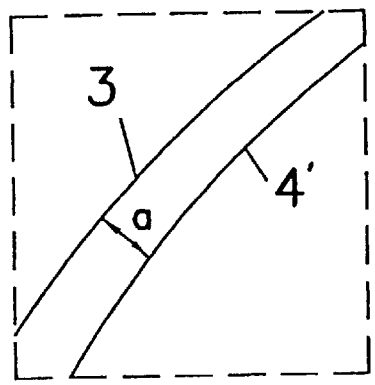

When the process as claimed in the invention and the etching medium proposed for this process are used, conversely exactly defined undercutting occurs so that the edge 4' as is shown in FIG. 3 has a uniform distance a from the edge 3 of the semiconductor wafer 1 and is smooth, especially essentially circular.

Prior to the etching process the semiconductor wafer 1 is coated entirely with a layer 9 of silicon dioxide which can have been applied for example by gaseous phase deposition (CVD=chemical vapor deposition). FIG. 5 shows for example one edge area of a semiconductor wafer (silicon wafer) and that not only the two large surfaces of the semiconductor wafer 1 (top and bottom), but also the edge 3 with the chamfers 6 and 7 and rounding 8 are coated with the silicon dioxide layer 9.

FIG. 6 shows conditions after etching and undercutting in which the silicon dioxide layer 9 has been completely removed from the top and the edge 3 of the semiconductor wafer 1. On the bottom a silicon dioxide layer 9 remains with an edge 4' which has a uniform distance from the edge 3 of the semiconductor wafer 1, as is shown in FIG. 3. Conventionally the distance a of the edge 4' from the edge 3 of the semiconductor wafer 1, therefore the area in which it has been undercut, is 1 to 3 mm.

In the following, examples for the etching medium used as claimed in the invention are given.

The chemicals used in the example are the following:
HF (50 w %; D=1.160 g/l; M$_{HF}$=20 g/mole; C$_{HF}$=29.0 mole/l) vinegar (100 w %; D=1.050 g/l; M$_{HAC}$=60 g/mole; C$_{HAC}$=17.5 mole/l)
propionic acid (100%; D=990 g/l; M$_{prop}$=74 g/mole; C$_{prop}$=13.5 mole/l) DI water=deionized water The parameters used in the experiments were the following:
Rpm of the semiconductor wafer: 500 rpm
N$_2$ volumetric flow: 150 l/min
Flow velocity of the etching medium: 1 l/mi
Temperature: 30° C.

In the examples, examples 0a and 0b do not relate to the process as claimed in the invention.

Example 0a

Etching medium: conc. HF; DI water 2:2 (=1:1)
(C$_{HF}$=14.5 mole/l; C$_x$=0 mole/l; molar ratio: HF:X=1.0)
Treatment time: 25 sec.
Width of undercutting: 2.5 mm, deviation±0.5 mm Example 0b Etching medium: conc. HF; DI water 1:3
(C$_{HF}$=7.3 mole/l; C$_x$=0 mole/l; molar ratio: HF:X 1.0)
Treatment time: 75 sec.
Width of undercutting: 2.5 mm, deviation±0.5 mm Example 1

Etching medium: conc. HF:glacial acetic acid:DI water 2:2:1
(C$_{HF}$=14.5 mole/l; C$_{HAC}$=4.4 mole/l; molar ratio: HF:HAc=3.3=roughly 10:3)
Treatment time: 25 sec.
Width of undercutting: 2.1 mm, deviation±0.2 mm Example 2
Etching medium: conc. HF:glacial acetic acid:DI water= 1:1:2
($C_{HF}$=7.3 mole/l; $C_{HAC}$=4.4 mole/l; molar ratio: HF:HAc= 1.66=roughly 5:3)
Treatment time: 50 sec.
Width of undercutting: 1.8 mm, deviation±0.15 mm Example 3
Etching medium: conc. HF:glacial acetic acid:DI water= 1:2:1
($C_{HF}$=7.3 mole/l; $C_{HAC}$=8.8 mole/l; molar ratio: HF:Hac= 0.83=5:6)
Treatment time: 50 sec.
Width of undercutting: 1.4 mm, deviation±0.08 mm Example 4
Etching medium: conc. HF:glacial acetic acid:DI water=1:0, 5:2.5 (=2:1:5)
($C_{HF}$=7.3 mole/l; $C_{HAC}$=2.2 mole/l; molar ratio: HF:HAc= 3.3=roughly 10:3)
Treatment time: 50 sec.
Width of undercutting: 2.0 mm, deviation±0.18 mm Example 5
Etching medium: conc. HF:ethyl alcohol (EtOH):DI water= 1:1:2
($C_{HF}$=7.3 mole/l; $C_{EtOH}$=4.3 mole/l; molar ratio: HF:EtOH= 1.7=roughly 5:3)

Example 6
Etching medium: conc. HF:glacial acetic acid=2:2 (=1:1)
($C_{HF}$=14.5 mole/l; $C_{HAC}$=8.8 mole/l; molar ratio: HF:HAc= 1.65=roughly 5:3)
Treatment time: 25 sec.
Width of undercutting: 1.8 mm, deviation±0.1 mm Example 7
Etching medium: conc. HF:propionic acid=2:2
Treatment time: 25 sec.
Width of undercutting: 1.8 mm, deviation±0.08 mm Example 8
Etching medium: conc. HF:propionic acid=1:1:2
Treatment time: 50 sec.
Width of undercutting: 1.8 mm, deviation±0.13 mm The width of undercutting and the "deviation" (deviation of the edge 4 or 4' from the ideal line) was determined by measurement in an optical microscope.

What is claimed is:

1. Process for wet etching of a semiconductor wafer to entirely remove from a first side of the semiconductor wafer a silicon dioxide layer, and to selectively remove from a first edge area of a second side of the semiconductor wafer the silicon dioxide layer, said process comprising the steps of:
    preparing a liquid etching medium which contains a component which is effective relative in removing the silicon dioxide layer; and
    rotating the semiconductor wafer and applying to the rotating semiconductor wafer the liquid etching medium to entirely etch the silicon dioxide layer from the first side and to selectively etch of the silicon dioxide layer located the second side only in the first edge area of the second side,
    wherein the etching medium comprises hydrofluoric acid and at least one carboxylic acid, and
    wherein the etching medium is allowed to flow around from the first side over an edge of the semiconductor wafer and onto the first edge area of the second side of the semiconductor wafer to selectively etch the silicon dioxide from the first edge area.

2. Process as claimed in claim 1, wherein the carboxylic acid is formic acid, acetic acid, propionic acid, butyric acid, benzoic acid, citric acid, oxalic acid, or lactic acid.

3. Process as claimed in claim 1, wherein an etching medium is applied in which the molar ratio between the hydrofluoric acid and carboxylic acid is 3:1 to 1:2.

4. Process as claimed in claim 1, wherein as the effective component the etching medium contains a combination of hydrofluoric acid and ammonium fluoride.

5. Process as claimed in claim 1, wherein the etching medium is applied to the rotating semiconductor wafer in a continuous stream.

6. Process as claimed in claim 1, wherein said etching step defines an etched width measured from the peripheral edge of the semiconductor wafer to an interface between the silicon dioxide unetched from the second side and the first edge area from which the silicon dioxide has been etched, and wherein said etched width deviates less than ±10%.

7. Process as claimed in claim 1, wherein the carboxylic acid is present as a salt or anhydride.

8. Process as claimed in claim 7, wherein the carboxylic acid is present as ammonium salt.

9. Process as claimed in claim 1, wherein an etching medium is applied which is diluted up to 90% with water.

10. Process as claimed in claim 9, wherein the etching medium is diluted with deionized water.

11. A process for wet etching of a semiconductor wafer having the entirety of a first side and a second side covered with a silicon dioxide layer, comprising the steps of:
    rotating the semiconductor wafer;
    applying a liquid etching medium comprising hydrofluoric acid and at least one carboxylic acid to the first side; and
    etching by allowing the etching medium to flow around from the first side over a peripheral edge of the semiconductor wafer and onto a first edge area of the second side of the semiconductor wafer which first edge area extends to an inside from the peripheral edge to completely etch the silicon dioxide layer from the first side, to selectively etch the silicon dioxide from the first edge area of the second side, and to leave unetched the silicon dioxide layer on the second side located apart from the first edge area.

12. Process as claimed in claim 11, wherein the carboxylic acid is formic acid, acetic acid, propionic acid, butyric acid, benzoic acid, citric acid, oxalic acid, or lactic acid.

13. Process as claimed in claim 11, wherein the etching medium further comprises ammonium fluoride.

14. Process as claimed in claim 10, wherein the etching medium is applied to the rotating semiconductor wafer in a continuous stream.

15. Process as claimed in claim 11, wherein the carboxylic acid is present as a salt or anhydride.

16. Process as claimed in claim 11, wherein the carboxylic acid is present as ammonium salt.

17. Process as claimed in claim 11, wherein the etching medium comprises a molar ratio between the hydrofluoric acid and carboxylic acid of 3:1 to 1:2.

18. Process as claimed in claim 17, wherein the etching medium is applied diluted up to 90% with water.

19. Process as claimed in claim 18, wherein the etching medium is diluted with deionized water.

* * * * *